(12) United States Patent
Choi

(10) Patent No.: US 8,604,830 B2
(45) Date of Patent: Dec. 10, 2013

(54) SEMICONDUCTOR DEVICE

(75) Inventor: Chang-Kyu Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/338,412

(22) Filed: Dec. 28, 2011

(65) Prior Publication Data

US 2013/0113523 A1    May 9, 2013

(30) Foreign Application Priority Data

Nov. 8, 2011    (KR) .................. 10-2011-0115999

(51) Int. Cl.
*H03K 19/0175* (2006.01)
*H03K 17/16* (2006.01)

(52) U.S. Cl.
USPC .............................. 326/82; 326/86; 326/30

(58) Field of Classification Search
USPC ................................. 326/30, 82–87
See application file for complete search history.

(56) References Cited

U.S. PATENT DOCUMENTS

| | | | |
|---|---|---|---|
| 6,794,900 B2 * | 9/2004 | Tang et al. | 326/86 |
| 6,897,685 B2 * | 5/2005 | Sato | 326/86 |
| 7,391,238 B2 | 6/2008 | Kim et al. | |
| 7,545,164 B2 * | 6/2009 | Song et al. | 326/30 |
| 2007/0046332 A1 * | 3/2007 | Tanaka | 326/83 |
| 2007/0075745 A1 * | 4/2007 | Song et al. | 326/83 |
| 2009/0033365 A1 * | 2/2009 | Miura | 326/82 |
| 2009/0146684 A1 * | 6/2009 | Kim | 326/30 |
| 2009/0231040 A1 | 9/2009 | Sohn | |
| 2013/0002301 A1 * | 1/2013 | Gondi et al. | 326/83 |

* cited by examiner

*Primary Examiner* — Thienvu Tran
(74) *Attorney, Agent, or Firm* — IP & T Group LLP

(57) ABSTRACT

A semiconductor device includes a main driving unit configured to serialize first and second data applied in parallel and output the serialized data to a data output pad, and an auxiliary driving unit configured to drive the data output pad in a period when the first and second data have different logic levels.

21 Claims, 12 Drawing Sheets

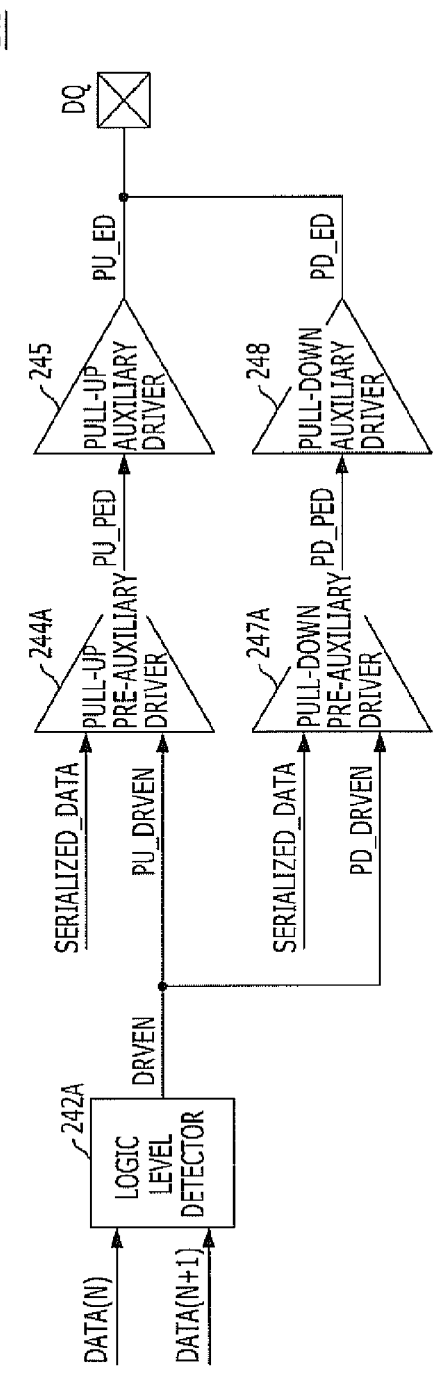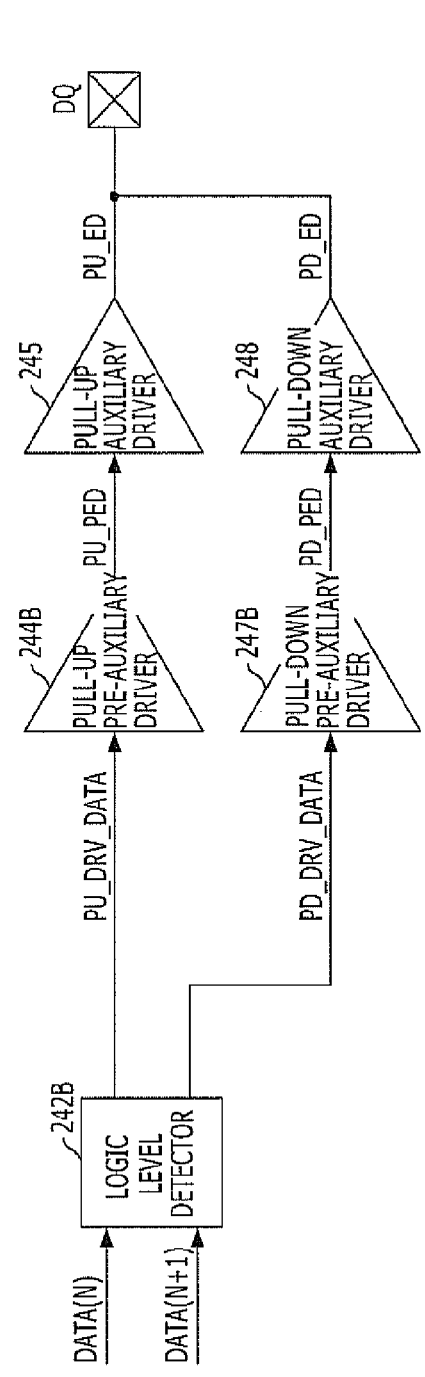
FIG. 2B
FIG. 2C

US 8,604,830 B2

SEMICONDUCTOR DEVICE

CROSS-REFERENCE TO RELATED APPLICATIONS

The present application claims priority of Korean Patent Application No. 10-2011-0115999, filed on Nov. 8, 2011, which is incorporated herein by reference in its entirety.

BACKGROUND

1. Field

Exemplary embodiments of the present invention relate to semiconductor design technology, and more particularly, to a semiconductor device including a data output circuit to support a pre-emphasis operation.

2. Description of the Related Art

FIG. 7 is a block diagram of a conventional data output circuit.

Referring to FIG. 7, the conventional data output circuit includes a pre-main driving unit 700 and a main driving unit 720.

The pre-main driving unit 700 is configured to invert and drive output data OUT_DATA.

The main driving unit 720 is configured to drive output data of the pre-main driving unit 700 to a data output pad DQ.

As such, the conventional data output circuit simply drives the output data OUT_DATA to the data output pad DQ without a pre-emphasis operation. Therefore, the data output circuit outputs a different swing amplitude of voltage depending on the pattern of the output data OUT_DATA, as indicated in a voltage level waveform of the data output pad DQ of FIGS. 6A and 6B (PRIOR ART).

That is, during a period A or C where the output data OUT_DATA rapidly changes between the patterns '0' and '1', the voltage level of the data output pad DQ swings between a voltage level lower than a power supply voltage VDD by a certain amount and a voltage level higher than a ground voltage VSS by a certain amount. However, during a period B where the pattern '0' or '1' of the output data OUT_DATA is maintained for a certain time or more, the voltage level of the data output pad DQ swings between the power supply voltage VDD and the ground voltage VSS.

As such, the swing amplitude of the conventional data output circuit may be irregularly varied depending on the pattern of the output data OUT_DATA. Accordingly, jitter characteristics may be degraded by an inter-symbol interference (ISI) effect in a data output channel.

SUMMARY

An embodiment of the present invention is directed to a data output circuit for supporting a pre-emphasis operation.

Another embodiment of the present invention is directed to a data output circuit capable of automatically applying a pre-emphasis operation in response to logic levels of output data which are successively inputted.

Another embodiment of the present invention is directed to a data output circuit capable of automatically setting an optimal pre-emphasis operation period regardless of frequency change of output data.

In accordance with an embodiment of the present invention, a semiconductor device includes: a main driving unit configured to serialize first and second data applied in parallel and output the serialized data to a data output pad; and an auxiliary driving unit configured to drive the data output pad in a period when the first and second data have different logic levels.

In accordance with another embodiment of the present invention, a semiconductor device includes: a main driving unit configured to receive output data and drive a data output pad; and an auxiliary driving unit configured to drive the data output pad when the output data and delayed data have different logic levels, wherein the delayed data is obtained by delaying the output data based on a data output period in response to a source clock signal.

BRIEF DESCRIPTION OF THE DRAWINGS

FIGS. 2B and 2C are block diagrams of an auxiliary driving unit shown in FIG. 2A.

DETAILED DESCRIPTION

Figure 1:
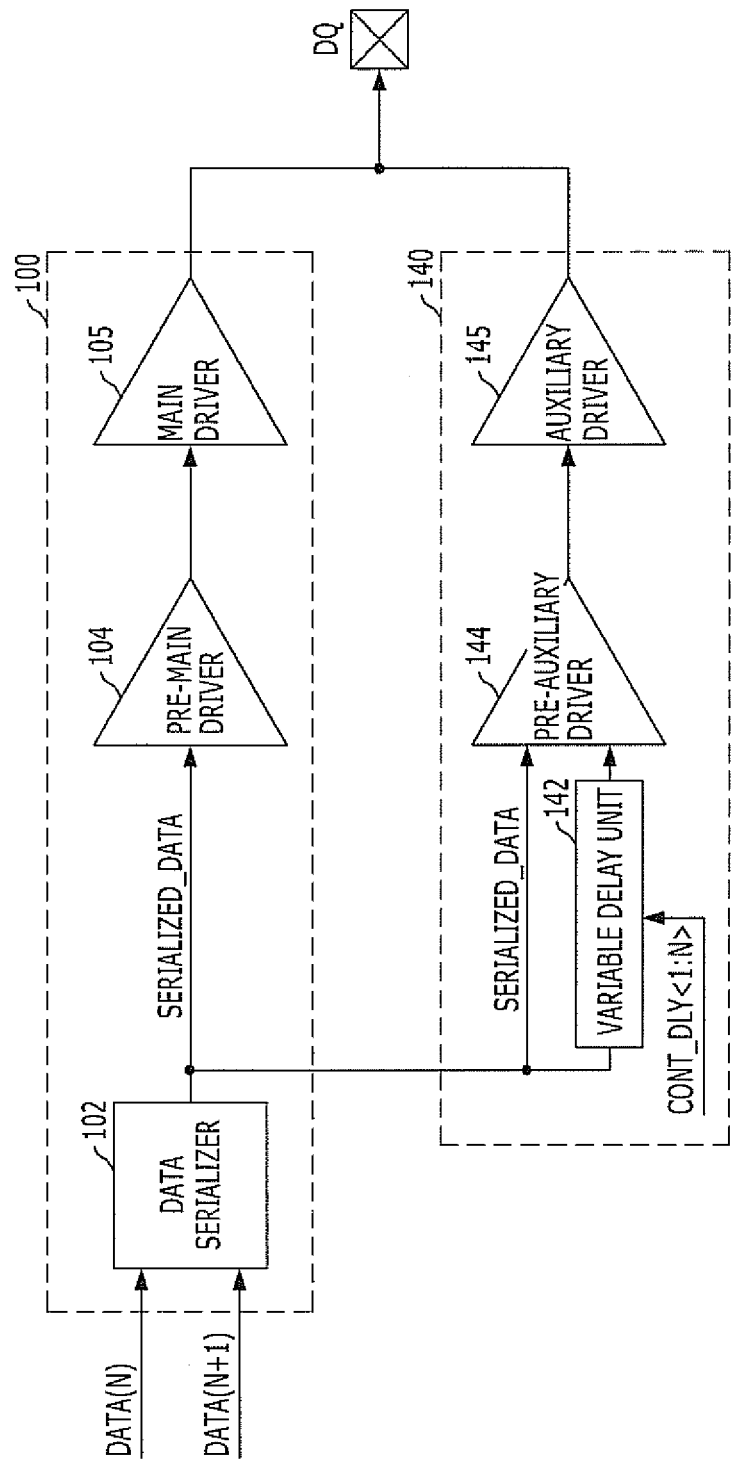
FIG. 1 is a block diagram illustrating a data output circuit for supporting a pre-emphasis operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

[First Embodiment]

FIG. 1 is a block diagram illustrating a data output circuit for supporting a pre-emphasis operation.

Referring to FIG. 1, the data output circuit for supporting a pre-emphasis operation includes a main driving unit 100 and an auxiliary driving unit 140. At this time, the main driving unit 100 includes a data serializer 102, a pre-main driver 104, and a main driver 105. Furthermore, the auxiliary driving unit 140 includes a variable delay unit 142, a pre-auxiliary driver 144, and an auxiliary driver 145.

The data serializer 102 is configured to serialize first and second data DATA<N> and DATA<N+1> which are applied in parallel and output the serialized data SERIALIZED_DATA.

The pre-main driver 104 is configured to first drive the serialized data SERIALIZED_DATA. The pre-main driver 104 may invert the data.

The main driver 105 is configured to drive output data of the pre-main driver 104 to the data output data DQ.

The variable delay unit 142 is configured to delay the serialized data SERIALIZED_DATA by a delay amount varying in response to a delay amount control signal CONT_DLY<1:N> and output the delayed data.

The pre-auxiliary driver 144 is configured to invert the serialized data SERIALIZED_DATA and output inverted data during a period corresponding to a delay amount difference between the serialized data SERIALIZED_DATA and the delayed data outputted from the variable delay unit 142, and it outputs no data in the other period.

The auxiliary driver 145 is configured to drive the output data of the pre-auxiliary driver 144 to the data output pad DQ.

The data output circuit illustrated in FIG. 1 performs a pre-emphasis operation through the auxiliary driving unit 140 at a time point when the main driving unit 100 drives the serialized data SERIALIZED_DATA. Therefore, the data output circuit may maintain the swing amplitude of the voltage level of the data output pad DQ, regardless of the patterns of the output data DATA<N> and DATA<N+1>.

However, the data output circuit of FIG. 1 is configured in such a manner that the period when the auxiliary driving unit 140 performs a pre-emphasis operation is determined by the delay amount of the variable delay unit 142. Therefore, when the operation frequencies of the output data DATA<N> and DATA<N+1> are varied, the delay amount of the variable delay unit 142 is to be controlled.

That is, the value of the delay amount control signal CONT_DLY<1:N> applied to the variable delay unit 142 is to be properly controlled in such a manner that the auxiliary driving unit 140 has an optimal pre-emphasis operation period.

Therefore, although not illustrated in FIG. 1, a circuit for generating the delay amount control signal CONT_DLY<1:N> and properly setting the value thereof is to be further provided.

Furthermore, in order for the auxiliary driving unit 140 to adequately support an effective pre-emphasis operation for various operation frequencies of the output data DATA<N> and DATA<N+1>, the range of the delay amount controlled by the variable delay unit 142 is to be great.

That is, in the data output circuit to support a pre-emphasis operation according to the method as shown in FIG. 1, as the variation range of the operation frequencies of the output data DATA<N> and DATA<N+1> increases, the area of the circuit added to effectively support a pre-emphasis operation, that is, the variable delay unit 142, also increases.

Figure 2A:
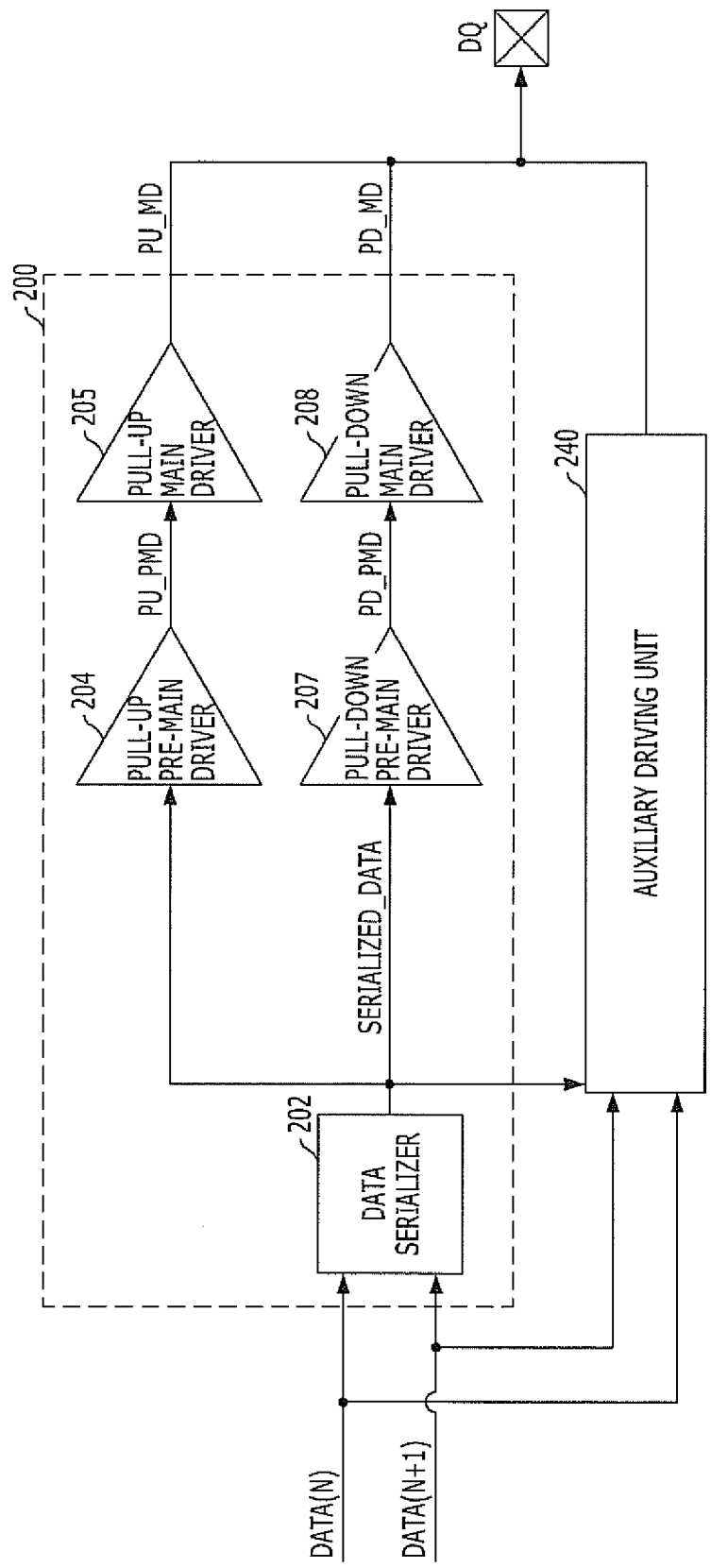
FIG. 2A is a block diagram of a data output circuit for supporting a pre-emphasis operation in accordance with a first embodiment of the present invention.

FIG. 2A is a block diagram of a data output circuit for supporting a pre-emphasis operation in accordance with a first embodiment of the present invention.

FIGS. 2B and 2C are block diagrams of an auxiliary driving unit shown in FIG. 2A.

Figure 3A:
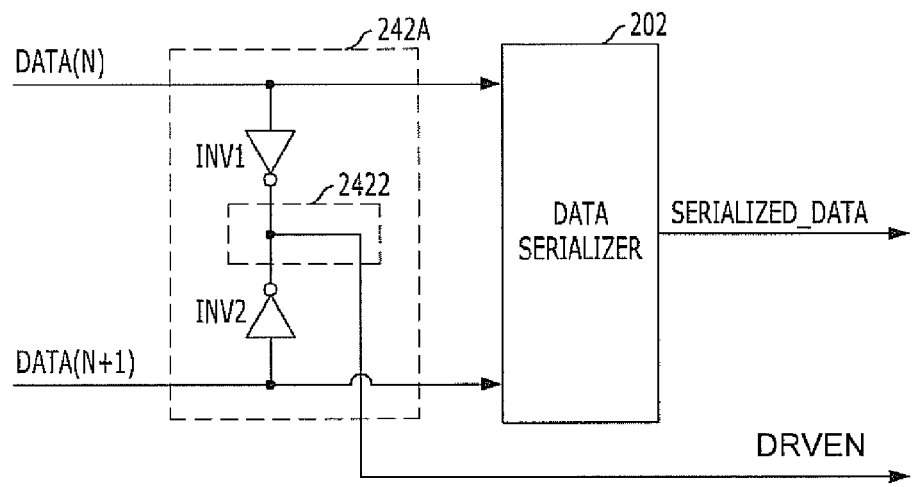
FIGS. 3A and 3B are detailed circuit diagrams of logic level detectors of FIGS. 2B and 2C in accordance with the first embodiment of the present invention.
Figure 3B:
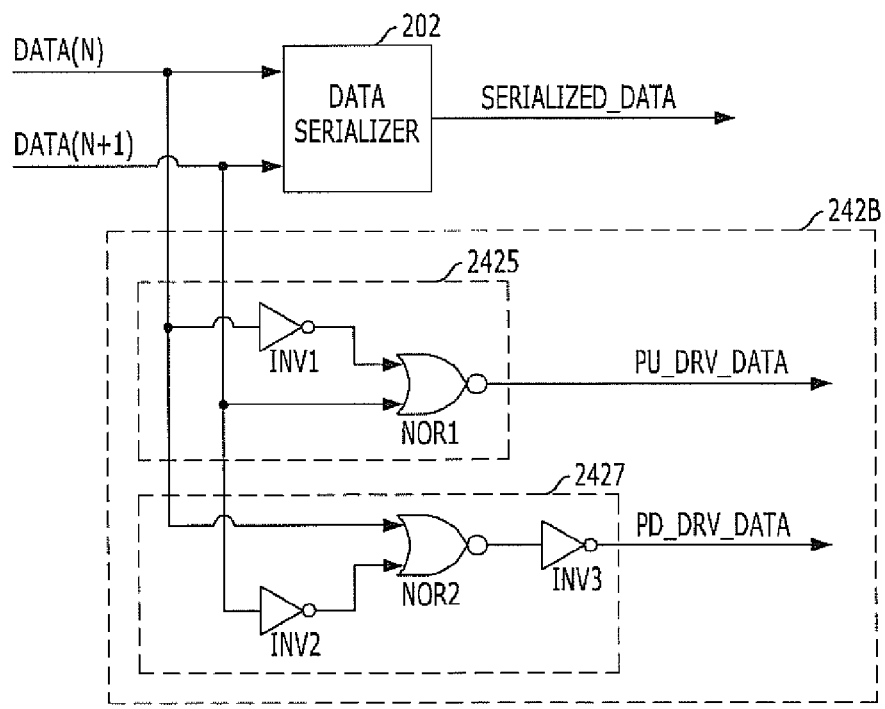

FIGS. 3A and 3B are detailed circuit diagrams of logic level detectors of FIGS. 2B and 2C in accordance with the first embodiment of the present invention.

Figure 3C:
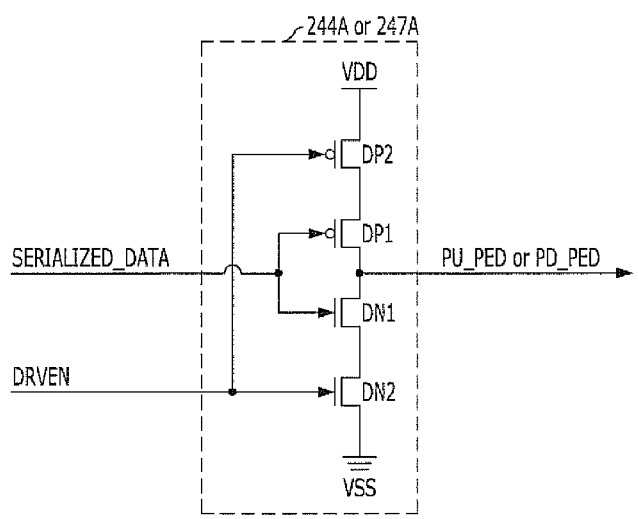
FIG. 3C is a detailed circuit diagram of a pre-auxiliary driver of FIG. 2B in accordance with the first embodiment of the present invention.

FIG. 3C is a detailed circuit diagram of a pre-auxiliary driver of FIG. 2B in accordance with the first embodiment of the present invention.

Referring to FIGS. 2A to 2C, the data output circuit for supporting a pre-emphasis operation in accordance with the first embodiment of the present invention includes a main driving unit 200 and an auxiliary driving unit 240. The main driving unit 200 includes a data serializer 202 and main drivers 204, 205, 207, and 208. The main drivers 204, 205, 206, and 208 include a pull-up pre-main driver 204, a pull-up main driver 205, a pull-down pre-main driver 207, and a pull-down main driver 208. Furthermore, the auxiliary driving unit 240 includes a logic level detector 242 and auxiliary drivers 244, 245, 247, and 248. The auxiliary drivers 244, 245, 247, and 248 include a pull-up pre-auxiliary driver 244, a pull-up auxiliary driver 245, a pull-down pre-auxiliary driver 247, and a pull-down auxiliary driver 248.

The main driving unit 200 is configured to serialize first and second data DATA<N> and DATA<N+1> applied in parallel and drive the serialized data SERIALIZED_DATA to a data output pad DQ.

The data serializer 202 of the main driving unit 200 is configured to serialize the first and second data DATA<N> and DATA<N+1> applied in parallel and output the serialized data SERIALIZED_DATA. At this time, although not specifically shown in the drawing, the data serialization is determined on the basis of toggling of an operation clock signal of the data output circuit. Since a specific method of the data serialization is well known, the detailed descriptions thereof are omitted herein.

The main drivers 204, 205, 207, and 208 of the main driving unit 200 drive the serialized data SERIALIZED_DATA which are sequentially outputted by the data serializer 202, that is, the first and second data DATA<N> and DATA<N+1>, to a data output pad DQ.

At this time, the pull-up pre-main driver 204 and the pull-down pre-main driver 207 included in the main drivers 204, 205, 207, and 208 drives the serialized data SERIALIZED_DATA. Furthermore, the pull-up main driver 205 and the pull-down main driver 208 pull-up and pull-down drive the data output pad DQ, that is, supply a power supply voltage VDD and a ground voltage VSS to the data output pad DQ in response to output data PU_PMD and PD_PMD outputted from the pull-up pre-main driver 204 and the pull-down pre-main driver 207.

For example, although not specifically illustrated, the pull-up pre-main driver 204 and the pull-down pre-main driver 207 may include an inverter configured to invert the serialized data SERIALIZED_DATA to output inverted serialized data/SERIALIZED_DATA as the output data PU_PMD and PD_PMD. Similarly, the pull-up main driver 205 may include a PMOS transistor configured to pull-up drive the data output pad DQ with the power supply voltage VDD when the inverted serialized data/SERIALIZED_DATA are at a logic low level, and the pull-down main driver 208 may include an NMOS transistor configured to pull-down drive the data output pad DQ with the ground voltage VSS when the inverted serialized data/SERIALIZED_DATA are at a logic high level.

The auxiliary driving unit 240 drives the data output pad DQ in a period, when the first and second data DATA<N> and data<N+1> applied in parallel have different logic levels, and does not drive the data output pad DQ in a period, when the first and second data DATA<N> and data<N+1> have the same logic level.

The logic level detector 242 and the auxiliary drivers 244, 245, 247, and 248 among the components of the auxiliary driving unit 240 may be configured in various types, e.g., two types as follows.

The first configuration of a logic level detector 242A and auxiliary drivers 244A, 245, 247A, and 248 will be described with reference to FIG. 2B.

The logic level detector 242A is configured to detect the logic levels of the first and second data DATA<N> and data<N+1> applied in parallel and control the voltage level of a driving enable signal DRVEN in response to the detection result.

The logic level detector 242A of the first type will be described in more detail as follows. The logic level detector 242A outputs the driving enable signal DRVEN having an intermediate voltage level VDD/2 between the power supply voltage level VDD and the ground voltage level VSS in a period when the first and second data DATA<N> and data<N+1> applied in parallel have different logic levels.

Furthermore, the logic level detector 242A outputs the driving enable signal DRVEN having the same level as the ground voltage VSS in a period when both of the first and second data DATA<N> and data<N+1> applied in parallel have a logic high level.

Furthermore, the logic level detector 242A outputs the driving enable signal DRVEN having the same level as the power supply voltage VDD in a period when both of the first and second data DATA<N> and data<N+1> applied in parallel have a logic low level.

FIG. 3A illustrates the detailed circuit configuration of the logic level detector 242A of the first type shown in FIG. 2B. That is, the logic level detector 242A includes a first inverter INV1, a second inverter INV2, and a driving enable signal output section 2422. The first inverter INV1 is configured to invert the first data DATA<N>. The second inverter INV2 is configured to invert the second data DATA<N+1>. The driving enable signal output section 2422 is configured to combine the output signal of the first inverter INV1 and the output signal of the second inverter INV2 and output the combined signal as the driving enable signal DRVEN.

At this time, when the output signal of the first inverter INV1 and the output signal of the second inverter INV2 are combined into the driving enable signal DRVEN, it means that the two output signals collide with each other. Therefore, when the two output signals have the power supply voltage level VDD corresponding to a logic high level, the logic level detector 242A outputs the driving enable signal DRVEN having the power supply voltage level VDD. Furthermore, when the two output signals have the ground voltage level VSS corresponding to a logic low level, the logic level detector 242A outputs the driving enable signal DRVEN having the ground voltage level VSS. However, when one of the two output signals has the power supply voltage level VDD corresponding to a logic high level and the other signal has the ground voltage VSS corresponding to a logic low level, the logic level detector 242A outputs the driving enable signal DRVEN having an intermediate voltage level VDD/2 between the power supply voltage level VDD and the ground voltage level VSS.

In the above-described configuration of the logic level detector 242A which controls the voltage level of the driving enable signal DRVEN depending on the logic levels of the first and second data DATA<N> and DATA<N+1>, the auxiliary drivers 244A, 245, 247A, and 248 drives the serialized data SERIALIZED_DATA which are sequentially outputted from the data serializer 202, that is, the first and second data DATA<N> and DATA<N+1>, to the data output pad DQ, and the operations thereof are controlled in response to the driving enable signal DRVEN.

Specifically, the pull-up pre-auxiliary driver 244A of the auxiliary drivers 244A, 245, 247A, and 248 inverts the serialized data SERIALIZED_DATA which are outputted by the data serializer 202, and the operation thereof is controlled in response to the driving enable signal DRVEN. The pull-up auxiliary driver 245 pull-up drives the data output pad DQ in response to output data PU_PED of the pull-up pre-auxiliary driver 244A.

Similarly, the pull-down pre-auxiliary driver 247A of the auxiliary drivers 244A, 245, 247A, and 248 inverts the serialized data SERIALIZED_DATA which are outputted by the data serializer 202, and the operation thereof is controlled in response to the driving enable signal DRVEN. The pull-down auxiliary driver 248 pull-down drives the data output pad DQ in response to output data PD_PED of the pull-down pre-auxiliary driver 247A.

For reference, a pull-up driving enable signal PU_DRVEN for controlling the operation of the pull-up pre-auxiliary driver 244A and a pull-down driving enable signal PD_DRVEN for controlling the operation of the pull-down pre-auxiliary driver 247A may have the same voltage level as the driving enable signal DRVEN outputted from the logic level detector 242. Therefore, the pull-up driving enable signal PU_DRVEN and the pull-down driving enable signal PD_DRVEN are not discriminated in the above-described configuration.

Although not specifically illustrated in the drawing, the above-described pull-up auxiliary driver 245 may include a PMOS transistor configured to pull-up drive the data output pad DQ with the power supply voltage VDD when the output data PU_PED is at a logic low level. Similarly, the pull-down auxiliary driver 248 may includes an NMOS transistor configured to pull-down drive the data output pad DQ with the ground voltage VSS when the output data PD_PED is at a logic high level.

FIG. 3C illustrates the detailed circuit configuration of the pull-up pre-auxiliary driver 244A or the pull-down pre-auxiliary driver 247A.

The pull-up pre-auxiliary driver 244A or the pull-down pre-auxiliary driver 247A includes first PMOS and NMOS transistors DP1 and DN1 and second PMOS and NMOS transistors DP2 and DN2. The first PMOS and NMOS transistors DP1 and DN1 are configured to invert and drive the serialized data SERIALIZED_DATA. The second PMOS transistor DP2 is configured to control the magnitude of current flowing from a power supply voltage terminal VDD to the first PMOS transistor DP1 in response to the voltage level of the driving enable signal DRVEN. The second NMOS transistor DN2 is configured to control the magnitude of current flowing from the first NMOS transistor DN1 to a ground voltage terminal VSS in response to the voltage level of the driving enable signal DRVEN.

At this time, the second PMOS and NMOS transistors DP2 and DN2 control the magnitude of the flowing current in an analog manner depending on the voltage level of the driving enable signal DRVEN. Therefore, even when the driving enable signal DRVEN has a voltage level corresponding to a voltage level obtained by dividing the power supply voltage VDD in half, a certain amount of current may be controlled to flow. Accordingly, the serialized data SERIALIZED_DATA may be inverted and driven.

Furthermore, when the voltage level of the driving enable signal DRVEN has the same level as the power supply voltage VDD, the serialized data SERIALIZED_DATA, i.e., the data DATA(N) and DATA(N+1) has the same voltage level as the ground voltage VSS corresponding to a logic low level (Referring to FIG. 3A). Therefore, the first NMOS transistor DN1 and the second PMOS transistor DP2 turn off and the serialized data SERIALIZED_DATA may not be inverted and driven.

Furthermore, when the voltage level of the driving enable signal DRVEN has the same level as the ground voltage VSS, the serialized data SERIALIZED_DATA has the same voltage level as the power supply voltage VDD corresponding to a logic high level. Therefore, the first PMOS transistor DP1 and the second NMOS transistor DN2 turn off and the serialized data SERIALIZED_DATA may not be inverted and driven.

The second configuration of a logic level detector 242B and auxiliary drivers 244B, 245, 247B, and 248 will be described with reference to FIG. 2C.

The logic level detector 242B is configured to detect the logic levels of the first and second data DATA<N> and DATA<N+1> applied in parallel and generate pull-up driving data PU_DRV_DATA and pull-down driving data PD_DRV_DATA of which the logic levels are determined in response to the detection result.

Referring to FIG. 3B, the configuration of the logic level detector 242B of the second type will be described in more detail as follows. The logic level detector 242B includes a pull-up logic level detection section 2425 and a pull-down logic level detection section 2427. The pull-up logic level detection section 2425 is configured to activate the pull-up driving data PU_DRV_DATA in a period, when the first data DATA<N> is at a logic high level and the second data DATA<N+1> is at a logic low level, and deactivate the pull-up driving data PU_DRV_DATA in the other period. The pull-down logic level detection section 2427 is configured to activate the pull-down driving data PD_DRV_DATA in a period, when the first data DATA<N> is at a logic low level and the second data DATA<N+1> is at a logic high level, and deactivate the pull-down driving data PD_DRV_DATA in the other period.

Here, the pull-up logic level detection section 2425 includes a first inverter INV1 and a first NOR gate NOR1. The first inverter INV1 is configured to invert the first data DATA<N>. The first NOR gate NOR1 is configured to perform a NOR operation on output data of the first inverter INV1 and the second data DATA<N+1> and output the pull-up driving data PU_DRV_DATA.

Furthermore, the pull-down logic level detection section 2427 includes a second inverter INV2, a second NOR gate NOR2, and a third inverter INV3. The second inverter INV2 is configured to invert the second data DATA<N+1>. The second NOR gate NOR2 is configured to perform a NOR operation on output data of the second inverter INV2 and the first data DATA<N>. The third inverter INV3 is configured to invert output data of the second NOR gate NOR2 and output the inverted data as the pull-down driving data PD_DRV_DATA.

In the above-described configuration of the logic level detector 242B which determines the logic levels of the pull-up driving data PU_DRV_DATA and the pull-down driving data PD_DRV_DATA in response to the logic levels of the first and second data DATA<N> and DATA<N+1>, the auxiliary drivers 244B, 245, 247B, and 248 include the pull-up auxiliary drivers 244B and 245 configured to pull-up drive the data output pad DQ in response to the pull-up driving data PU_DRV_DATA and the pull-down auxiliary drivers 247B and 248 configured to pull-down drive the data output pad DQ in response to the pull-down driving data PD_DRV_DATA.

At this time, the pull-up auxiliary drivers 244B and 245 includes the pull-up pre-auxiliary driver 244B and the pull-up auxiliary driver 245. Furthermore, the pull-down auxiliary drivers 247B and 248 include the pull-down pre-auxiliary driver 247B and the pull-down auxiliary driver 248.

Specifically, the pull-up pre-auxiliary driver 244B inverts the pull-up driving data PU_DRV_DATA outputted from the logic level detector 242B and outputs the inverted data as data PU_PED. The pull-up auxiliary driver 245 pull-up drives the data output pad DQ with the power supply voltage VDD in response to the data PU_PED outputted from the pull-up pre-auxiliary driver 244B.

Similarly, the pull-down pre-auxiliary driver 247B inverts the pull-down driving data PD_DRV_DATA outputted from the logic level detector 242B and output the inverted data as data PD_PED. The pull-down auxiliary driver 248 pull-down drives the data output pad DQ with the ground voltage VSS in response to the data PD_PED outputted from the pull-down pre-auxiliary driver 247B.

Although not specifically illustrated, the pull-up pre-auxiliary driver 244B and the pull-down pre-auxiliary driver 247B may include inverters configured to invert the pull-up driving data PU_DRV_DATA and the pull-down driving data PD_DRV_DATA, respectively.

Similarly, the pull-up auxiliary driver 245 may include a PMOS transistor configured to pull-up drive the data output pad DQ with the power supply voltage VDD when the data PU_PED is at a logic low level, and the pull-down auxiliary driver 248 may include an NMOS transistor configured to pull-down drive the data output pad DQ with the ground voltage VSS when the data PD_PED is at a logic high level.

Based on the above-described configuration, the operation of the data output circuit for supporting a pre-emphasis operation in accordance with the first embodiment of the present invention will be described as follows.

Figure 6A:
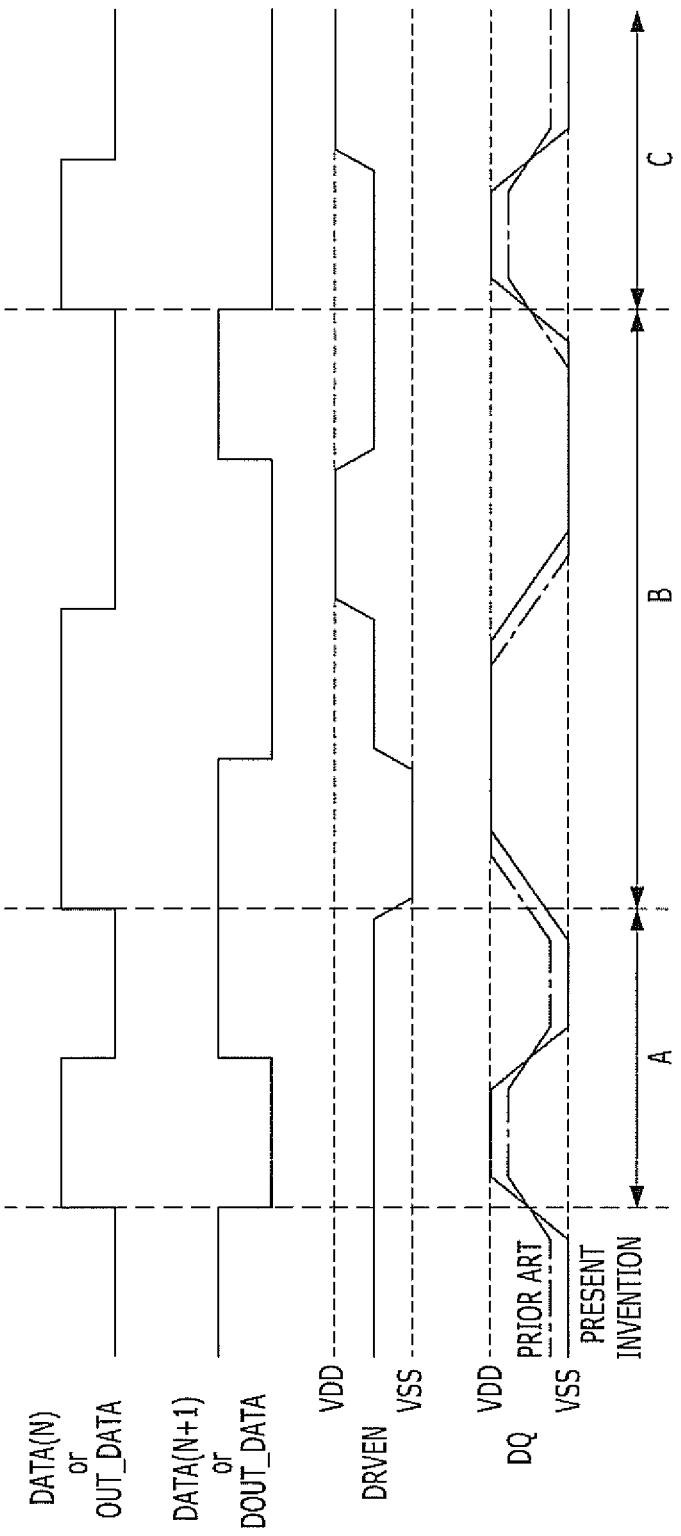
FIGS. 6A and 6B are timing diagrams illustrating the operation of the data output circuit for supporting a pre-emphasis operation in accordance with the embodiments of the present invention.
Figure 6B:
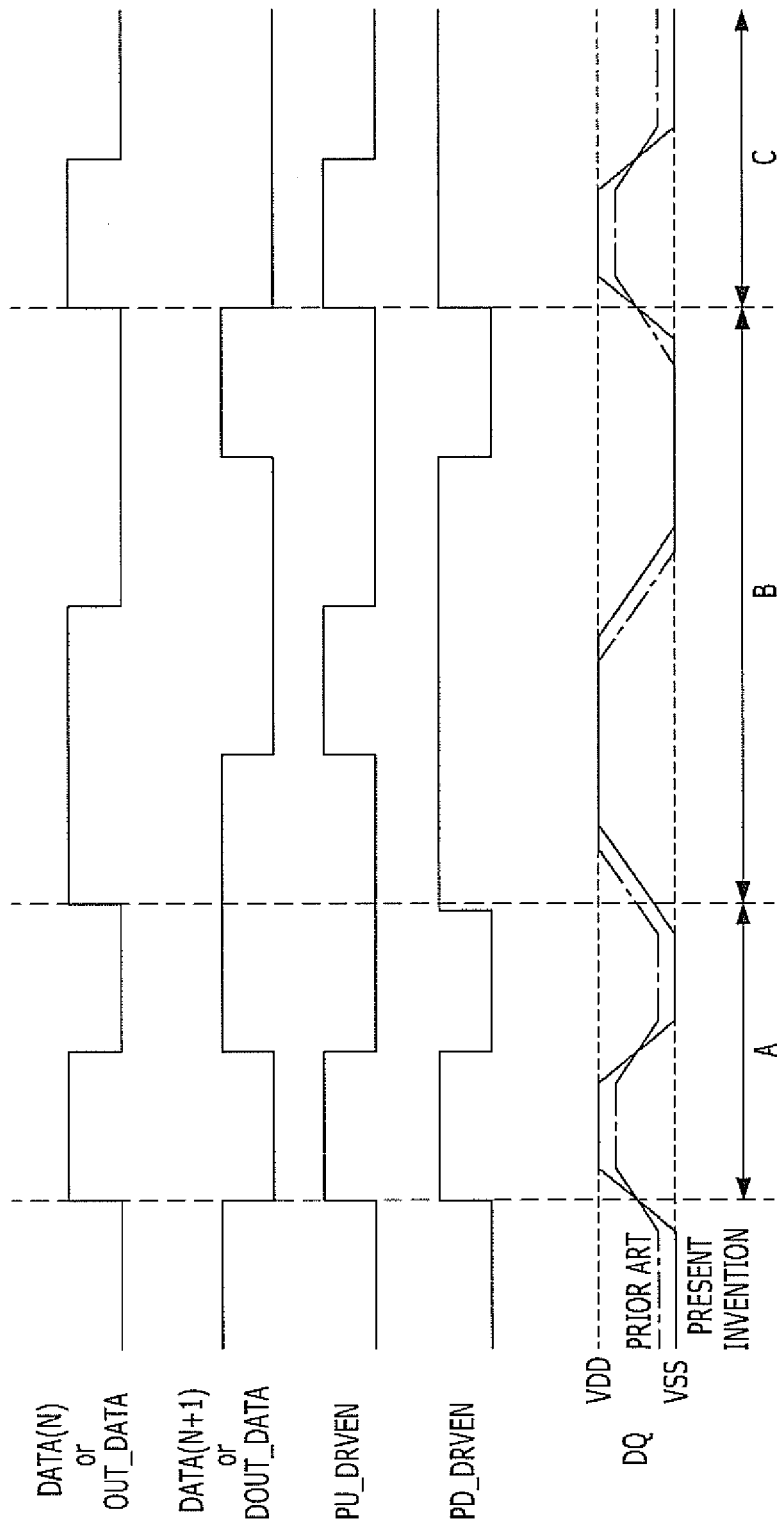
Figure 7:
FIG. 7 is a block diagram of a conventional data output circuit.

FIGS. 6A and 6B are timing diagrams illustrating the operation of the data output circuit for supporting a pre-emphasis operation in accordance with the first embodiment of the present invention.

FIG. 6A is a timing diagram showing the operation of the data output circuit including the logic level detector 242A and the auxiliary drivers 244A, 245, 247A, and 248 of the first type, which have been described with reference to FIGS. 2B, 3A, and 3C.

Referring to FIG. 6A, when the values of the first data DATA<N> vary as a pattern of 'H'→'L'→'H'→'H'→'L'→'H'→'L', the values of the second data DATA<N+1> vary as a pattern of 'L'→'H'→'H'→'L'→'L'→'H'→'L'→'L'.

Therefore, the driving enable signal DRVEN has a voltage level corresponding to an intermediate level between the power supply voltage VDD and the ground voltage VSS in a period where the first and second data DATA<N> and DATA<N+1> have different logic levels. Furthermore, the driving enable signal DRVEN has a voltage level corresponding to the ground voltage VSS in a period where both of the first and second data DATA<N> and DATA<N+1> are at a high level 'H'. Furthermore, the driving enable signal DRVEN has a voltage level corresponding to the power supply voltage VDD in a period where both of the first and second data DATA<N> and DATA<N+1> are at a low level 'L'.

As the voltage level of the driving enable signal DRVEN varies, the voltage level of the data output pad DQ varies in a different manner from 'PRIOR ART'.

That is, during the period where the driving enable signal DRVEN has a voltage level corresponding to an intermediate level between the power supply voltage VDD and the ground voltage VSS, the voltage level of the data output pad DQ swings between the power supply voltage VDD and the ground voltage VSS, unlike the voltage level swing corresponding to 'PRIOR ART'.

At this time, during the period where the driving enable signal DRVEN has a voltage level corresponding to the power supply voltage VDD or the ground voltage VSS, the serialized data SERIALIZED_DATA maintain the same logic level during at least two data output periods. Furthermore, during this period, the voltage level of the data output pad DQ swings between the power supply voltage VDD and the ground voltage VSS without a pre-emphasis operation, similarly to the 'PRIOR ART'.

FIG. 6B is a timing diagram showing the operation of the data output circuit including the logic level detector 242B and the auxiliary drivers 244B, 245, 247B, and 248 of the second type, which have been described with reference to FIGS. 2C and 3B.

Referring to FIG. 6B, when the values of the first data DATA<N> vary as a pattern of 'H'→'L'→'H'→'H'→'L'→'L'→'H'→'L', the values of the second data DATA<N+1> vary as a pattern of 'L'→'H'→'H'→'L'→'L'→'H'→'L'→'L'.

Therefore, during a period where the first data DATA<N> is at a logic high level and the second data DATA<N+1> is at a logic low level, the pull-up driving data PU_DRV_DATA is activated to a logic high level, and the pull-down driving data PD_DRV_DATA is deactivated to a logic high level. Furthermore, during a period where the first data DATA<N> is at a logic low level and the second data DATA<N+1> is at a logic high level, the pull-up driving data PU_DRV_DATA is deactivated to a logic low level, and the pull-down driving data PD_DRV_DATA is activated to a logic low level. Furthermore, during a period where both of the first and second data DATA<N> and DATA<N+1> are at a logic high level or logic low level, the pull-up driving data PU_DRV_DATA is deactivated to a logic low level, and the pull-down driving data PD_DRV_DATA is deactivated to a logic high level.

As the logic levels of the pull-up driving data PU_DRV_DATA and the pull-down driving data PD_DRV_DATA vary, the voltage levels of the data output pad DQ vary in a different manner from 'PRIOR ART'.

That is, the voltage level according to 'PRESENT INVENTION' swings in a different manner from the voltage level according to 'PRIOR ART'. Specifically, during the period where the pull-up driving data PU_DRV_DATA is activated to a logic high level, the voltage level of the data output data DQ rises to the voltage level corresponding to the power supply voltage VDD. Furthermore, during the period where the pull-down driving data PD_DRV_DATA is activated to a logic low level, the voltage level of the data output pad DQ falls to the voltage level corresponding to the ground voltage VSS.

At this time, during the period where both of the pull-up driving data PU_DRV_DATA and the pull-down driving data PD_DRV_DATA are deactivated, the serialized data SERIALIZED_DATA maintain the same logic level during at least two data output periods. Therefore, during this period, the voltage level of the data output pad DQ swings between the power supply voltage VDD and the ground voltage VSS without a pre-emphasis operation, similarly to the 'PRIOR ART'.

When the embodiment of the present invention is applied as described above, the pre-emphasis operation may be automatically performed depending on which logic level the serialized data SERIALIZED_DATA has during two successive data output periods.

Therefore, regardless of which output pattern the serialized data SERIALIZED_DATA has, the swing amplitude of the voltage level of the data output pas DQ may be constantly maintained at all times.

Furthermore, since the pre-emphasis operation period is automatically determined on the basis of the data output period synchronized with a clock signal, an optimal pre-emphasis operation period may be automatically set regardless of an operation frequency variation of the data output circuit, and the data output circuit occupies a constant area regardless of the operation frequency variation of the data output circuit.

[Second Embodiment]

Figure 4A:
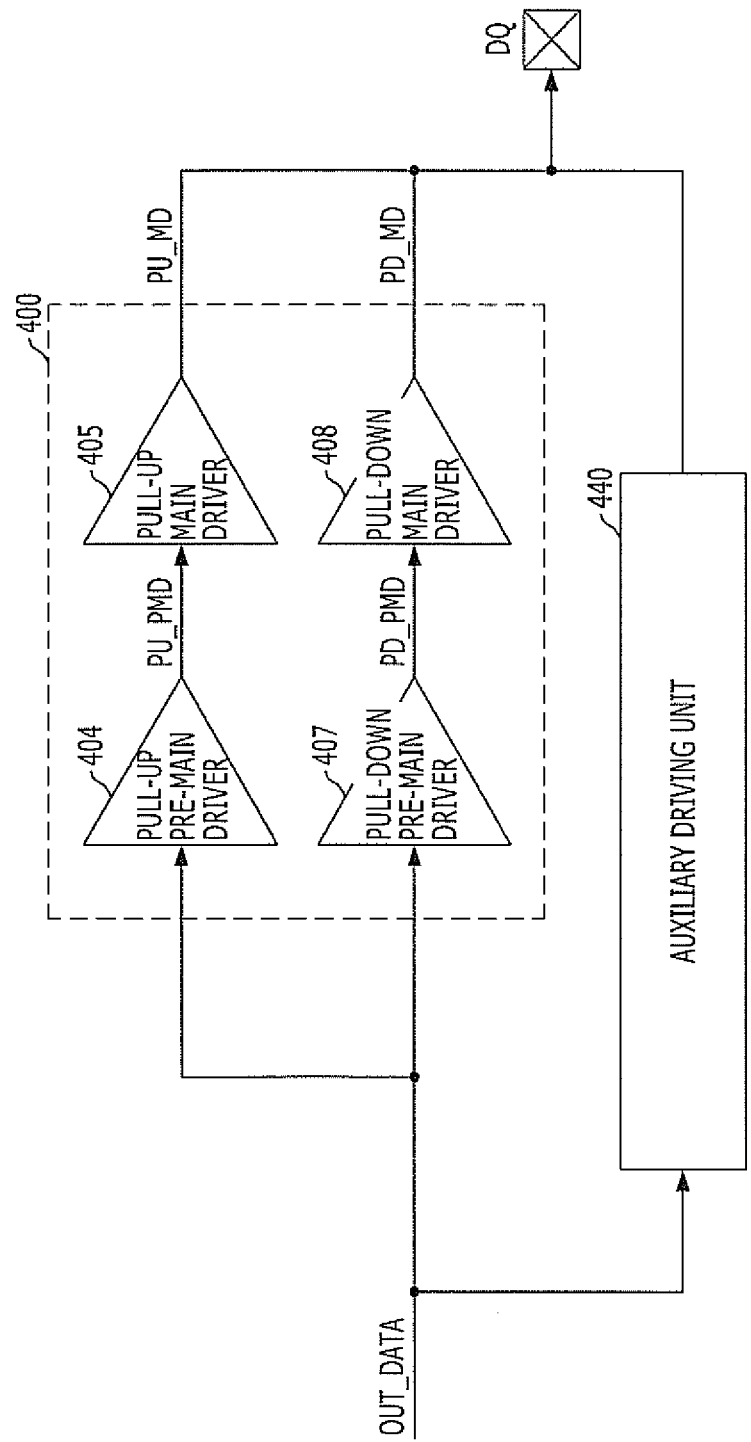
FIG. 4A is a block diagram illustrating a data output circuit for supporting a pre-emphasis operation in accordance with a second embodiment of the present invention.

FIG. 4A is a block diagram illustrating a data output circuit for supporting a pre-emphasis operation in accordance with a second embodiment of the present invention.

Figure 4B:
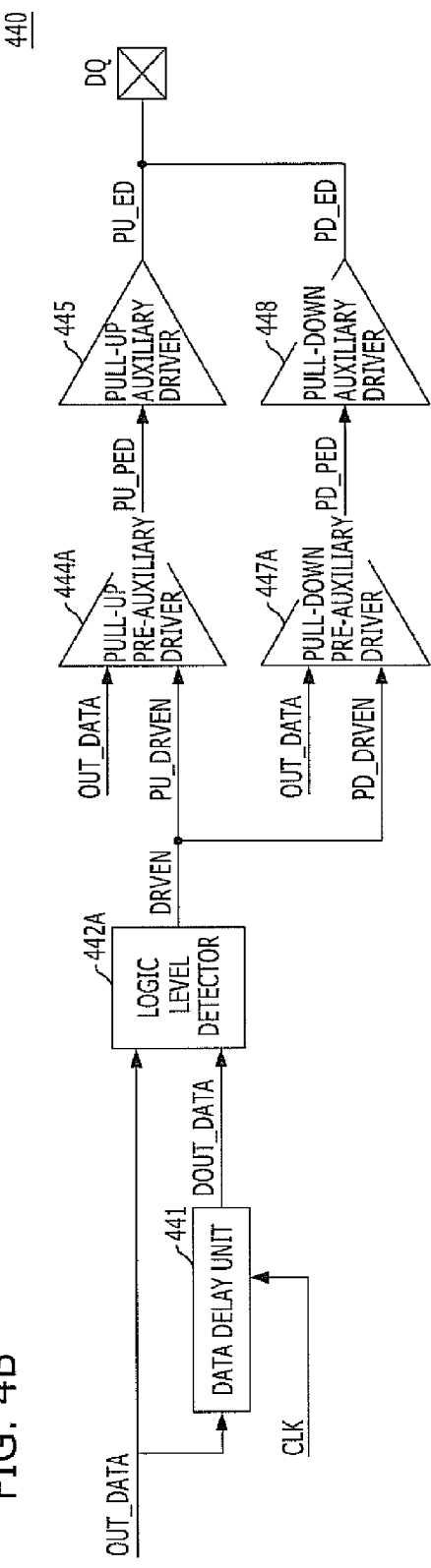
FIGS. 4B and 4C are block diagrams of an auxiliary driving unit shown in FIG. 4A.
Figure 4C:
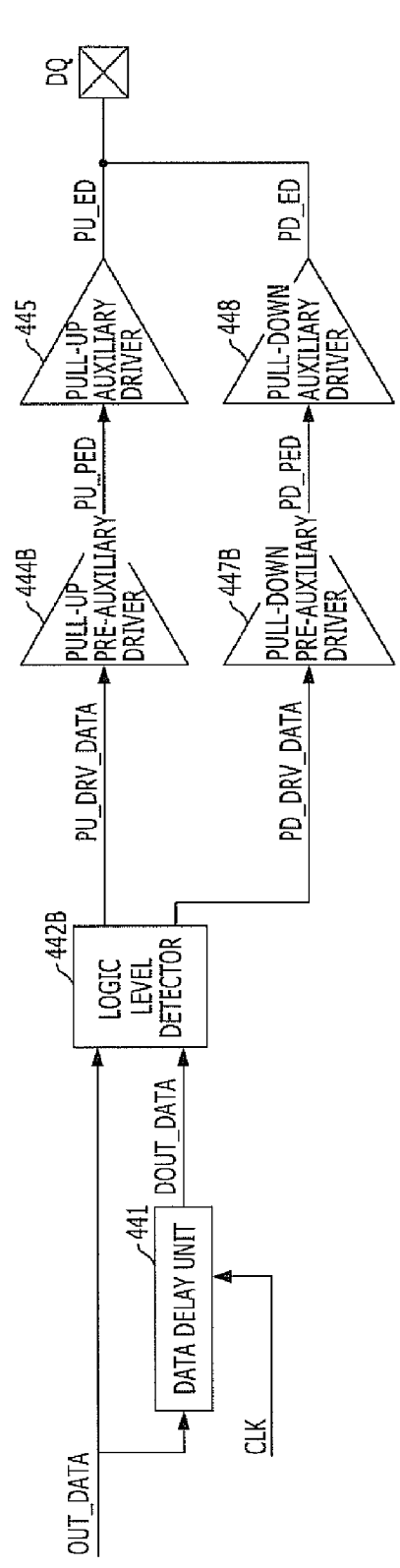

FIGS. 4B and 4C are block diagrams of an auxiliary driving unit shown in FIG. 4A.

Figure 5A:
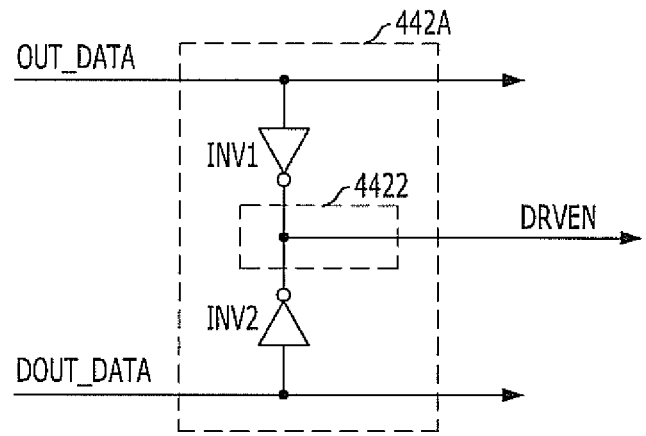
FIGS. 5A and 5B are detailed circuit diagrams of logic level detectors of FIGS. 4B and 4C in accordance with the second embodiment of the present invention.
Figure 5B:
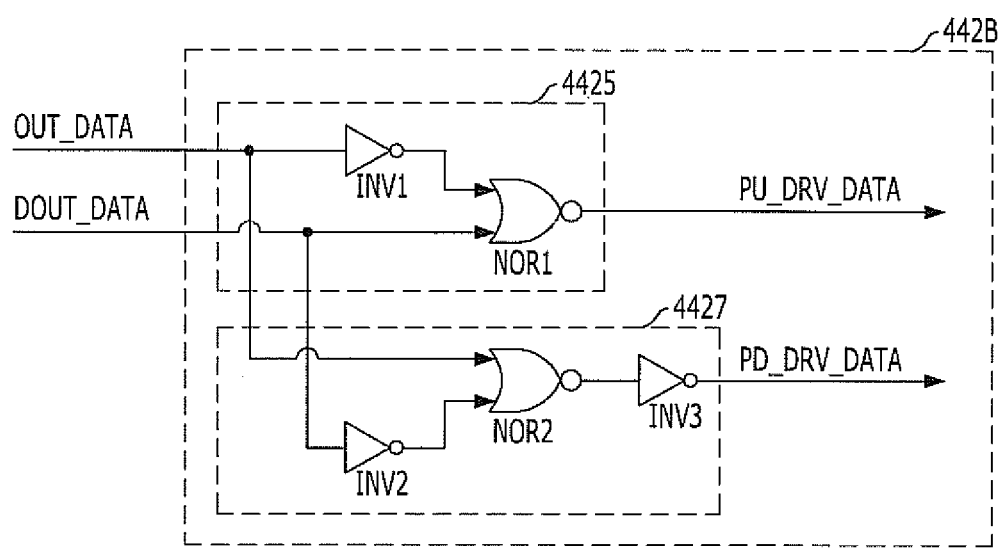

FIGS. 5A and 5B are detailed circuit diagrams of logic level detectors of FIGS. 4B and 4C in accordance with the second embodiment of the present invention.

Figure 5C:
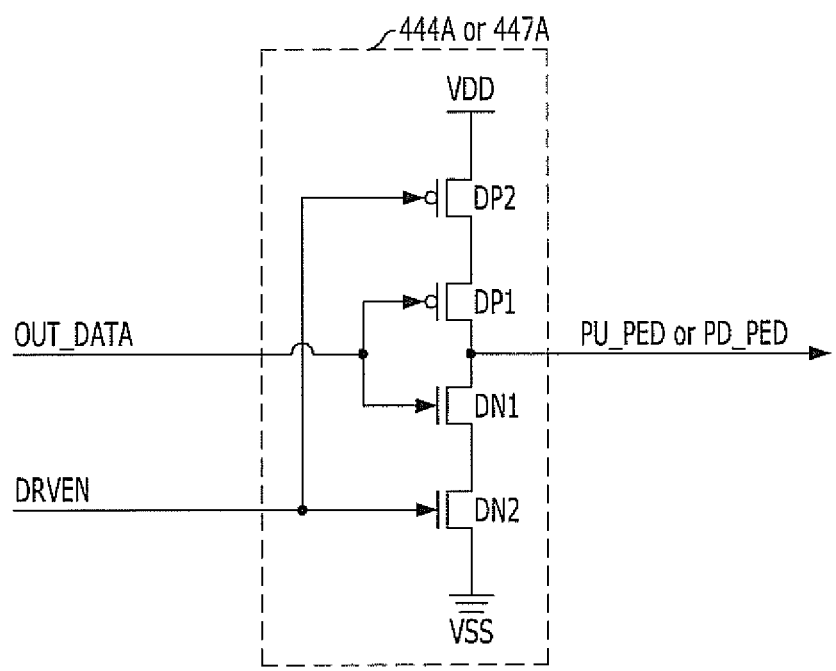
FIG. 5C is a detailed circuit diagram of a pre-auxiliary driver of FIG. 4B in accordance with the second embodiment of the present invention.

FIG. 5C is a detailed circuit diagram of a pre-auxiliary driver of FIG. 4B in accordance with the second embodiment of the present invention.

Referring to FIGS. 4A to 4C, the data output circuit for supporting a pre-emphasis operation in accordance with the second embodiment of the present invention includes a main driving unit 400 and an auxiliary driving unit 440. The main driving unit 400 includes a pull-up pre-main driver 404, a pull-up main driver 405, a pull-down pre-main driver 407, and a pull-down main driver 408. Furthermore, the auxiliary driving unit 440 includes a data delay unit 441, a logic level detector 442, and auxiliary drivers 444, 445, 447, and 448. The auxiliary drivers 444, 445, 447, and 448 include a pull-up pre-auxiliary driver 444, a pull-up auxiliary driver 445, a pull-down pre-auxiliary driver 447, and a pull-down auxiliary driver 448.

The main driving unit 400 is configured to receive output data OUT_DATA and drives the received data to a data output pad DQ.

The pull-up pre-main driver 404 and the pull-down pre-main driver 407 of the main driving unit 400 are configured to drives the output data OUT_DATA. The pull-up main driver 405 and the pull-down main driver 408 are configured to pull-up drive and pull-down drive the data output pad DQ with a power supply voltage VDD and a ground voltage VSS in response to output data PU_PMD and PD_PMD outputted from the pull-up pre-main driver 404 and the pull-down pre-main driver 407.

For example, although not specifically illustrated in the drawing, the pull-up pre-main driver 404 and the pull-down pre-main driver 407 may include an inverter configured to invert the output data OUT_DATA and output the inverted output data/OUT_DATA as the output data PU_PMD and PD_PMD. Similarly, the pull-up main driver 405 may include a PMOS transistor configured to pull-up drive the data output pad DQ with the power supply voltage VDD when the inverted output data/OUT_DATA is at a logic low level, and the pull-down main driver 408 may include an NMOS transistor configured to pull-down drive the data output pad DQ with the ground voltage VSS when the inverted output data/OUT_DATA is at a logic high level.

The auxiliary driving unit 440 drives the data output pad DQ when delayed data DOUT_DATA obtained by delaying the output data OUT_DATA by one data period based on a source clock signal CLK has a different level from the output data OUT_DATA, and it does not drive the data output pad DQ when the delayed data DOUT_DATA has the same level as the output data OUT_DATA.

Here, the source clock signal CLK serves as an operation reference clock signal of the data output circuit. Therefore, one data period of the output data OUT_DATA may be determined on the basis of the source clock signal CLK. For example, when the data output circuit has a structure of outputting one output data OUT_DATA among a plurality of serialized output data every cycle tck of the source clock signal CLK, one data period may correspond to one cycle of the source clock signal CLK. On the other hands, when the data output circuit has a structure of outputting one data OUT_DATA among the plurality of serialized output data every half period tck/2 of the source clock signal CLK, one data period may correspond to a half cycle of the source clock signal.

Therefore, when the output data OUT_DATA is delayed by one data period, the data delay unit 441 includes a latch-type delay circuit which operates in synchronization with the source clock signal CLK. That is, the delay circuit is configured in a different type from the variable delay unit 142 which delays the serialized data SERIALISED DATA in desynchronization with the source clock signal CLK, which has been described with reference to FIG. 1. Specifically, in the variable delay unit 142 described with reference to FIG. 1, the plurality of inverters are coupled in series, and the delay amount thereof is determined in response to the delay control signal DLY_CONT<1:N>. Therefore, in order to increase the entire delay amount controlled depending on the frequency of the source clock signal CLK, a larger number of inverters may be provided. Accordingly, the area of the delay circuit inevitably increases. However, the data delay unit 441 illustrated in FIG. 4 is a delay circuit including two inverters coupled in a latch type, and it performs a delay operation in synchronization with the source clock signal CLK. The data delay unit 441 has a constant area regardless of frequency change of the source clock signal CLK.

The logic level detector 442 and the auxiliary drivers 444, 445, 447, and 448 of the auxiliary driving unit 440 may be configured in various types, e.g., two types as follows.

The first configuration of a logic level detector 442A and auxiliary drivers 444A, 445, 447A, and 448 will be described with reference to FIG. 4B.

The logic level detector 442A is configured to detect the logic levels of the output data OUT_DATA and the delayed data DOUT_DATA and control the voltage level of a driving enable signal DRVEN in response to the detection result.

More specifically, the logic level detector 442A of the first type outputs the driving enable signal DRVEN having an intermediate level VDD/2 between the power supply voltage VDD and the ground voltage VSS in a period when the output data OUT_DATA and the delayed data DOUT_DATA have different logic levels.

Furthermore, the logic level detector 442A outputs the driving enable signal DRVEN having the same voltage level as the ground voltage VSS in a period when both of the output data OUT_DAT and the delayed data DOUT_DATA have a logic high level.

Furthermore, the logic level detector 442A outputs the driving enable signal DRVEN having the same voltage level as the power supply voltage VDD in a period when both of the output data OUT_DATA and the delayed data DOUT_DATA have a logic low level.

FIG. 5A illustrates the detailed circuit configuration of the logic level detector 442A of the first type shown in FIG. 4B. The logic level detector 442A includes a first inverter INV1, a second inverter INV2, and an enable signal output section 4422. The first inverter INV1 is configured to invert the output data OUT_DATA. The second inverter INV2 is configured to invert the delayed data DOUT_DATA. The enable signal output section 4422 is configured to combine an output signal of the first inverter INV1 and an output signal of the second inverter INV2 and output the combined signal as the driving enable signal DRVEN.

At this time, when the output signal of the first inverter INV1 and the output signal of the second inverter INV2 are combined into the driving enable signal DRVEN, it means that the two output signals collide with each other. Therefore, when the two output signals have the power supply voltage level VDD corresponding to a logic high level, the logic level detector 442A outputs the driving enable signal DRVEN having the power supply voltage level VDD. Furthermore, when the two output signals have the ground voltage level VSS corresponding to a logic low level, the logic level detector 442A outputs the driving enable signal DRVEN having the ground voltage level VSS. However, when one of the two output signals has the power supply voltage level VDD corresponding to a logic high level and the other signal has the ground voltage VSS corresponding to a logic low level, the logic level detector 242A outputs the driving enable signal DRVEN having an intermediate level VDD/2 between the power supply voltage level VDD and the ground voltage level VSS.

In the above-described configuration of the logic level detector 442A which controls the voltage level of the driving enable signal DRVEN depending on the logic levels of the output data OUT_DATA and the delayed data DOUT_DATA, the auxiliary drivers 444A, 445, 447A, and 448 drive the output data OUT_DATA to the data output pad DQ, and the operations thereof are controlled in response to the voltage level of the driving enable signal DRVEN.

Specifically, the pull-up pre-auxiliary driver 444A of the auxiliary drivers 444A, 445, 447A, and 448 inverts the output data OUT_DATA, and the operation thereof is controlled in response to the driving enable signal DRVEN. The pull-up auxiliary driver 445 pull-up drives the data output pad DQ in response to the output data PU_PED of the pull-up pre-auxiliary driver 444A.

Similarly, the pull-down pre-auxiliary driver 447A of the auxiliary drivers 444A, 445, 447A, and 448 inverts the output data OUT_DATA, and the operation thereof is controlled in response to the driving enable signal DRVEN. The pull-down auxiliary driver 448 pull-down drives the data output pad DQ in response to the output data PD_PED of the pull-down pre-auxiliary driver 447A.

For reference, a pull-up driving enable signal PU_DRVEN for controlling the operation of the pull-up pre-auxiliary driver 444A and a pull-down driving enable signal PD_DRVEN for controlling the operation of the pull-down pre-auxiliary driver 447A may have the same voltage level as the driving enable signal DRVEN outputted from the logic level detector 442A. Therefore, the pull-up driving enable signal PU_DRVEN and the pull-down driving enable signal PD_DRVEN are not discriminated in the above-described configuration.

Although not specifically illustrated in the drawing, the pull-up auxiliary driver 445 may include a PMOS transistor configured to pull-up drive the data output pad DQ with the power supply voltage VDD when the output data PU_PED is at a logic low level. Similarly, the pull-down auxiliary driver 448 may include an NMOS transistor configured to pull-down the data output pad DQ with the ground voltage VSS when the output data PD_PED is at a logic high level.

FIG. 5C illustrates the detailed circuit configuration of the pull-up pre-auxiliary driver 444A or the pull-down pre-auxiliary driver 447A.

Specifically, the pull-up pre-auxiliary driver 444A or the pull-down pre-auxiliary driver 447A includes first PMOS and NMOS transistors DP1 and DN1 and second PMOS and NMOS transistors DP2 and DN2. The first PMOS and NMOS transistors DP1 and DN1 are configured to invert and drive the output data OUT_DATA. The second PMOS transistor DP2 is configured to control the magnitude of current flowing from the power supply voltage terminal VDD to the first PMOS transistor DP1 in response to the voltage level of the driving enable signal DRVEN. The second NMOS transistor DN2 is configured to control the magnitude of current flowing from the first NMOS transistor DN1 to the ground voltage terminal VSS in response to the voltage level of the driving enable signal DRVEN.

At this time, the second PMOS and NMOS transistors DP2 and DN2 control the magnitude of the flowing current in an analog manner depending on the voltage level of the driving enable signal DRVEN. Therefore, even when the voltage level of the driving enable signal DRVEN corresponds to a voltage level obtained by dividing the power supply voltage VDD in half, a certain amount of current may be controlled to flow. Accordingly, the output data OUT_DATA may be inverted and driven.

Furthermore, when the driving enable signal DRVEN has the same level as the power supply voltage VDD, the output data OUT_DATA has the same voltage level as the ground voltage corresponding to a logic low level (Referring to FIG. 5A). Therefore, the first NMOS transistor DN1 and the second PMOS transistor DP2 turn off and the output data OUT_DATA may not be inverted and driven.

Furthermore, when the driving enable signal DRVEN has the same level as the ground voltage VSS, the output data OUT_DATA has the same voltage level as the power supply voltage VDD corresponding to a logic high level. Therefore, the first PMOS transistor DP1 and the second NMOS transistor DN2 turn off and the output data OUT_DATA may not be inverted and driven.

The second configuration of a logic level detector 442B and auxiliary drivers 444B, 445, 447B, and 447 will be described with reference to FIG. 4C.

The logic level detector 442B is configured to detect the logic levels of the output data OUT_DATA and delayed data DOUT_DATA and generate pull-up driving data OUT_DATA and pull-down driving data PD_DRV_DATA of which the logic levels are determined in response to the detection result.

The logic level detector 442B of the second type will be described in more detail with reference to FIG. 5B. The logic level detector 442B includes a pull-up logic level detection section 4425 and a pull-down logic level detection section 4427. The pull-up logic level detection section 4425 is configured to activate the pull-up driving data PU_DRV_DATA in a period, when the output data OUT_DATA is at a logic high level and the delayed data DOUT_DATA is at a logic low level, and deactivate the pull-up driving data PD_DRV_DATA in the other period. The pull-down logic level detection section 4427 is configured to activate the pull-down driving data PD_DRV_DATA in a period, when the output data OUT_DATA is at a logic low level and the delayed data DOUT_DATA is at a logic high level, and deactivate the pull-down driving data PD_DRV_DATA in the other period.

Here, the pull-up logic level detection section 4425 includes a first inverter INV1 and a first NOR gate NOR1. The first inverter INV1 is configured to invert the output data OUT_DATA. The first NOR gate NOR1 is configured to perform a NOR operation on output data of the first inverter INV1 and the delayed data DOUT_DATA and output the pull-up driving data PU_DRV_DATA.

Furthermore, the pull-down logic level detection section 4427 includes a second inverter INV2, a second NOR gate NOR2, and a third inverter INV3. The second inverter INV2 is configured to invert the delayed data DOUT_DATA. The second NOR gate NOR2 is configured to perform a NOR operation on output data of the second inverter INV2 and the output data OUT_DATA. The third inverter INV3 is configured to invert output data of the second NOR gate NOR2 and output the inverted data as the pull-down driving data PD_DRV_DATA.

In the above-described configuration of the logic level detector 442B which determined the logic levels of the pull-up driving data PU_DRV_DATA and the pull-down driving data PD_DRV_DATA in response to the logic levels of the output data OUT_DATA and the delayed data DOUT_DATA, the auxiliary drivers 444B, 445, 447B, and 448 include pull-up auxiliary drivers 444B and 445 configured to pull-up drive the data output pad DQ in response to the pull-up driving data PU_DRV_DATA and pull-down auxiliary drivers 447B and 448 configured to pull-down drive the data output pad DQ in response to the pull-down driving data PD_DRV_DATA.

At this time, the pull-up auxiliary drivers 444B and 445 include a pull-up pre-auxiliary driver 444B and a pull-up auxiliary driver 445, and the pull-down auxiliary drivers 447B and 448 include a pull-down pre-auxiliary driver 447B and a pull-down auxiliary driver 448.

Specifically, the pull-up pre-auxiliary driver 444B inverts the pull-up driving data PU_DRV_DATA outputted from the logic level detector 442B and outputs the inverted data as data PU_PED. The pull-up auxiliary driver 445 pull-up drives the data output pad DQ with the power supply voltage VDD in response to the data PU_PED outputted from the pull-up pre-auxiliary driver 444B.

Similarly, the pull-down pre-auxiliary driver 44713 inverts the pull-down driving data PD_DRV_DATA outputted from the logic level detector 442B and outputs the inverted data as data PD_PED. The pull-down auxiliary driver 448 pull-down drives the data output pad DQ with the ground voltage VSS in response to the data PD_PED outputted from the pull-down pre-auxiliary driver 447B.

Although not specifically illustrated, the pull-up pre-auxiliary driver 444B and the pull-down pre-auxiliary driver 447B may include inverters configured to invert the pull-up driving data PU_DRV_DATA and the pull-down driving data PU_DRV_DATA, respectively.

Similarly, the pull-up auxiliary driver 445 may include a PMOS transistor configured to pull-up drive the data output pad DQ with the power supply voltage VDD when the data PU_PED is at a logic low level, and the pull-down auxiliary driver 448 may include an NMOS transistor configured to pull-down drive the data output pad DQ with the ground voltage VSS when the data PD_PED is at a logic high level.

Based on the above-described configuration, the operation of the data output circuit for supporting a pre-emphasis operation in accordance with the second embodiment of the present invention will be described as follows.

FIGS. 6A and 613 are timing diagrams illustrating the operation of the data output circuit for supporting a pre-emphasis operation in accordance with the second embodiment of the present invention.

FIG. 6A is a timing diagram showing the operation of the data output circuit including the logic level detector 442A and the auxiliary drivers 444A, 445, 447A, and 448 of the first type, which have been described with reference to FIGS. 4B, 5A, and 5C.

Referring to FIG. 6A, when the values of the output data OUT_DATA vary as a pattern of 'H'→'L'→'H' 'H' 'L' 'L' 'H'→'L', the values of the delayed data DOUT_DATA obtained by delaying the output data OUT_DATA by one data period vary as a pattern of 'L'→'H'→'H'→'L' 'H'→'L'→'L'.

Therefore, the driving enable signal DRVEN has a voltage level corresponding to an intermediate level between the power supply voltage VDD and the ground voltage VSS in a period where the output data OUT_DATA and the delayed data DOUT_DATA have different logic levels. Furthermore, the driving enable signal DRVEN has a voltage level corresponding to the ground voltage VSS in a period where both of the output data OUT_DATA and the delayed data DOUT_DATA are at a high level 'H'. Furthermore, the driving enable signal DRVEN has a voltage level corresponding to the power supply voltage VDD in a period where both of the output data OUT_DATA and the delayed data DOUT_DATA are at a low level 'L'.

As the voltage level of the driving enable signal DRVEN varies, the voltage level of the data output pad DQ varies in a different manner from 'PRIOR ART'.

That is, during the period where the driving enable signal DRVEN has a voltage level corresponding to an intermediate level between the power supply voltage VDD and the ground voltage VSS, the voltage level of the data output pad DQ swings between the power supply voltage VDD and the ground voltage VSS, unlike the voltage level swing corresponding to 'PRIOR ART'.

At this time, during the period where the driving enable signal DRVEN has a voltage level corresponding to the power supply voltage VDD or the ground voltage VSS, the output data OUT_DATA maintain the same logic level during at least two data output periods. Furthermore, during this period, the voltage level of the data output pad DQ swings between the power supply voltage VDD and the ground voltage VSS without a pre-emphasis operation, similarly to the 'PRIOR ART'.

FIG. 6B is a timing diagram showing the operation of the data output circuit including the logic level detector 442B and the auxiliary drivers 444B, 445, 447B, and 448 of the second type, which have been described with reference to FIGS. 4C and 5B.

Referring to FIG. 6B, when the values of the output data OUT_DATA vary as a pattern of 'H'→'L'→'H'→'H'→'L'→'L'→'H'→'L', the values of the delayed data DOUT_DATA obtained by delaying the output data OUT_DATA by one data period vary as a pattern of 'L'→'H'→'H'→'L'→'L'→'H'→'L'→'L'.

Therefore, during a period where the output data OUT_DATA is at a logic high level and the delayed data DOUT_DATA is at a logic low level, the pull-up driving data PU_DRV_DATA is activated to a logic high level, and the pull-down driving data PD_DRV_DATA is deactivated to a logic high level. Furthermore, during a period where the output data OUT_DATA is at a logic low level and the delayed data DOUT_DATA is at a logic high level, the pull-up driving data PU_DRV_DATA is deactivated to a logic low level, and the pull-down driving data PD_DRV_DATA is activated to a logic low level. Furthermore, during a period where both of the output data OUT_DATA and the delayed data DOUT_DATA are at a logic high level or logic low level, the pull-up driving data PU_DRV_DATA is deactivated to a logic low level, and the pull-down driving data PD_DRV_DATA is deactivated to a logic high level.

As the logic levels of the pull-up driving data PU_DRV_DATA and the pull-down driving data PD_DRV_DATA vary, the voltage level of the data output pad DQ varies in a different manner from 'PRIOR ART'.

That is, the voltage level corresponding to 'PRESENT INVENTION' swings in a different manner from the voltage level wing corresponding to 'PRIOR ART'. Specifically, during the period where the pull-up driving data PU_DRV_DATA is activated to a logic high level, the voltage level of the data output data DQ rises to the voltage level corresponding to the power supply voltage VDD. Furthermore, during the period where the pull-down driving data PD_DRV_DATA is activated to a logic low level, the voltage level of the data output pad DQ falls to the voltage level corresponding to the ground voltage VSS.

At this time, during the period where both of the pull-up driving data PU_DRV_DATA and the pull-down driving data PD_DRV_DATA are deactivated, the output data OUT_DATA maintain the same logic level during at least two data output periods. Therefore, during this period, the voltage level of the data output pad DQ swings between the power supply voltage VDD and the ground voltage VSS without a pre-emphasis operation, similarly to the 'PRIOR ART'.

When the data output circuit in accordance with the second embodiment of the present invention is applied as described above, the pre-emphasis operation may be automatically performed depending on which logic levels the output data OUT_DATA and the delayed data DOUT_DATA obtained by delaying the output data by one data period have. Therefore, regardless of which output pattern the output data OUT_DATA have, the swing amplitude of the voltage level of the data output pad DQ may be constantly maintained at all times.

At this time, since the pre-emphasis operation period is automatically determined on the basis of the data output period synchronized with the clock signal, an optimal pre-emphasis operation period may be automatically set regardless of operation frequency change of the data output circuit. The data output circuit occupies a constant area regardless of the operation frequency change of the data output circuit.

In accordance with the embodiments of the present invention, a pre-emphasis operation may be automatically performed depending on which logic levels the serialized output data, e.g., two successive output data, have.

Accordingly, regardless of which output pattern the serialized output data have, the swing amplitude of the voltage level of the data output pad may be constantly maintained.

Furthermore, since the pre-emphasis operation period is automatically determined based on the data output period synchronized with the clock signal, an optimal pre-emphasis operation period may automatically set at all times, regardless of operation frequency change of the data output circuit, and the data output circuit occupies a constant area regardless of the operation frequency change.

While the present invention has been described with respect to the specific embodiments, it will be apparent to those skilled in the art that various changes and modifications may be made without departing from the spirit and scope of the invention as defined in the following claims.

What is claimed is:
1. A semiconductor device comprising:
a main driving unit configured to serialize first and second data applied in parallel and output the serialized data to a data output pad; and
an auxiliary driving unit configured to drive the data output pad in a period when the first and second data have different logic levels, and not to drive the data output pad in a period when the first and second data have the same logic levels.

2. The semiconductor device of claim 1, wherein the main driving unit comprises:
   a data serializer configured to serialize the first and second data; and
   a main driver configured to output the serialized data, which are sequentially outputted from the data serializer, to the data output pad.

3. The semiconductor device of claim 2, wherein the auxiliary driving unit comprises:
   a logic level detector configured to detect logic levels of the first and second data and control a voltage level of a driving enable signal in response to the detection result; and
   an auxiliary driver configured to output the serialized data, which are sequentially outputted from the data serializer, to the data output pad in response to the voltage level of the driving enable signal.

4. The semiconductor device of claim 3, wherein the logic level detector is configured to output the driving enable signal having an intermediate level between a power supply voltage level and a ground voltage level in the period when the first and second data have different logic levels, output the driving enable signal having the same voltage level as the ground voltage level in a period when both of the first and second data have a logic high level, and output the driving enable signal having the same voltage level as the power supply voltage level in a period where both of the first and second data have a logic low level.

5. The semiconductor device of claim 4, wherein the logic level detector comprises:
   a first inverter configured to invert the first data;
   a second inverter configured to invert the second data; and
   a driving enable signal output section configured to combine an output signal of the first inverter and an output signal of the second inverter and output the combined signal as the driving enable signal.

6. The semiconductor device of claim 3, wherein the auxiliary driver is configured to supply the data output pad with a power supply voltage or a ground voltage in the period when the first and second data have different logic levels and block the supplying in a period when the first and second data have the same logic level.

7. The semiconductor device of claim 6, wherein the auxiliary driver comprises:
   a pull-up pre-auxiliary driver configured to invert the serialized data in response to the driving enable signal;
   a pull-up auxiliary driver configured to supply the data output pad with the power supply voltage in response to an output data of the pull-up pre-auxiliary driver;
   a pull-down pre-auxiliary driver configured to invert the serialized data in response to the driving enable signal; and
   a pull-down auxiliary driver configured to supply the data output pad with the ground voltage in response to an output data of the pull-down pre-auxiliary driver.

8. The semiconductor device of claim 1, wherein the auxiliary driving unit comprises:
   a logic level detector configured to detect logic levels of the first and second data and generate pull-up and pull-down driving data of which logic levels are determined in response to the detection result;
   a pull-up auxiliary driver configured to output the pull-up driving data to the data output pad; and
   a pull-down auxiliary driver configured to output the pull-down driving data to the data output pad.

9. The semiconductor device of claim 8, wherein the logic level detector comprises:
   a pull-up logic level detection section configured to activate the pull-up driving data in a period when the first data is at a logic high level and the second data is at a logic low level; and
   a pull-down logic level detection section configured to activate the pull-down driving data in a period when the first data is at a logic low level and the second data is at a logic high level.

10. The semiconductor device of claim 9, wherein the pull-up logic level detection section comprises:
    a first inverter configured to invert the first data; and
    a first NOR gate configured to perform a NOR operation on an output data of the first inverter and the second data and output the pull-up driving data.

11. The semiconductor device of claim 10, wherein the pull-down logic level detection section comprises:
    a second inverter configured to invert the second data;
    a second NOR gate configured to perform a NOR operation on an output data of the second inverter and the first data; and
    a third inverter configured to invert an output data of the second NOR gate and output the inverted data as the pull-down driving data.

12. A semiconductor device comprising:
    a main driving unit configured to receive output data and drive a data output pad; and
    an auxiliary driving unit configured to drive the data output pad when the output data and delayed data have different logic levels, wherein the delayed data is obtained by delaying the output data based on a data output period in response to a source clock signal, and not to drive the data output pad when the delayed data has the same level as the output data.

13. The semiconductor device of claim 12, wherein the auxiliary driving unit comprises:
    a data delay unit configured to delay the output data by a unit period of the data output period in response to the source clock signal and output the delayed data;
    a logic level detector configured to detect logic levels of the delayed data and the output data and control a voltage level of a driving enable signal in response to the detection result; and
    an auxiliary driver configured to output the output data to the data output pad in response to the voltage level of the driving enable signal.

14. The semiconductor device of claim 13, wherein the logic level detector is configured to output the driving enable signal having an intermediate level between a power supply voltage level and a ground voltage level in the period when the delayed data and the output data have different logic levels, output the driving enable signal having the same voltage level as the ground voltage level in a period when both of the delayed data and the output data have a logic high level, and output the driving enable signal having the same voltage level as the power supply voltage level in a period when both of the delayed data and the output data have a logic low level.

15. The semiconductor device of claim 14, wherein the logic level detector comprises:
    a first inverter configured to invert the output data;
    a second inverter configured to invert the delayed data; and
    a driving enable signal output section configured to combine an output signal of the first inverter and an output signal of the second inverter and output the combined signal as the driving enable signal.

16. The semiconductor device of claim 13, wherein the auxiliary driver is configured to supply the data output pad with a power supply voltage or a ground voltage in the period when the output data and the delayed data have different logic levels and block the supplying in a period when the output data and the delayed data have the same logic level.

17. The semiconductor device of claim 16, wherein the auxiliary driver comprises:
   a pull-up pre-auxiliary driver configured to invert the output data in response to the driving enable signal;
   a pull-up auxiliary driver configured to supply the data output pad with the power supply voltage in response to and output data of the pull-up pre-auxiliary driver;
   a pull-down pre-auxiliary driver configured to invert the output data in response to the driving enable signal; and
   a pull-down auxiliary driver configured to supply the data output pad with the ground voltage in response to an output data of the pull-down pre-auxiliary driver.

18. The semiconductor device of claim 12, wherein the auxiliary driving unit comprises:
   a data delay unit configured to delay the output data by a unit period of the data output period in response to a source clock signal and output the delayed data;
   a logic level detector configured to detect logic levels of the delayed data and the output data and generate pull-up and pull-down driving data of which logic levels are determined in response to the detection result;
   a pull-up auxiliary driver configured to output the pull-up driving data to the data output pad; and
   a pull-down auxiliary driver configured to output the pull-down driving data to the data output pad.

19. The semiconductor device of claim 18, wherein the logic level detector comprises:
   a pull-up logic level detection section configured to activate the pull-up driving data in a period when the output data is at a logic high level and the delayed data is at a logic low level; and
   a pull-down logic level detection section configured to activate the pull-down driving data in a period when the output data is at a logic low level and the delayed data is at a logic high level.

20. The semiconductor device of claim 19, wherein the pull-up logic level detection section comprises:
   a first inverter configured to invert the output data; and
   a NOR gate configured to perform a NOR operation on an output data of the first inverter and the delayed data and output the pull-up driving data.

21. The semiconductor device of claim 20, wherein the pull-down logic level detection section comprises:
   a second inverter configured to invert the delayed data;
   a second NOR gate configured to perform a NOR operation on an output data of the second inverter and the output data; and
   a third inverter configured to invert an output data of the second NOR gate and output the inverted data as the pull-down driving data.

* * * * *